(12) United States Patent
Munoz-Rojas (10) Patent No.: US 12,043,894 B2
(45) Date of Patent: Jul. 23, 2024

(54) COMPACT HEAD AND COMPACT SYSTEM FOR VAPOR DEPOSITION

(71) Applicant: Centre National De La Recherche Scientifique, Paris (FR)

(72) Inventor: David Munoz-Rojas, Grenoble (FR)

(73) Assignee: Centre National De La Recherche Scientifique, Paris (FR)

( * ) Notice: Subject to any disclaimer, the term of this patent is extended or adjusted under 35 U.S.C. 154(b) by 842 days.

(21) Appl. No.: 17/263,256

(22) PCT Filed: Jul. 30, 2019

(86) PCT No.: PCT/EP2019/070450
§ 371 (c)(1),
(2) Date: Jan. 26, 2021

(87) PCT Pub. No.: WO2020/025593
PCT Pub. Date: Feb. 6, 2020

(65) Prior Publication Data
US 2021/0140047 A1    May 13, 2021

(30) Foreign Application Priority Data

Jul. 30, 2018 (FR) ...................................... 1857072

(51) Int. Cl.
*C23C 16/455* (2006.01)
*B33Y 80/00* (2015.01)

(52) U.S. Cl.
CPC ........ *C23C 16/45565* (2013.01); *B33Y 80/00* (2014.12); *C23C 16/45551* (2013.01)

(58) Field of Classification Search
CPC .............. B33Y 80/00; C23C 16/45551; C23C 16/45565
See application file for complete search history.

(56) References Cited

U.S. PATENT DOCUMENTS

| 4,389,973 A | 6/1983 | Suntola et al. |
| 5,545,436 A * | 8/1996 | Saito ................. C23C 16/45595 118/729 |

(Continued)

FOREIGN PATENT DOCUMENTS

| CN | 101578391 A | 11/2009 |
| CN | 101809193 A | 8/2010 |

(Continued)

OTHER PUBLICATIONS

International Searching Authority, International Search Report (ISR) and Written Opinion received for International Application No. PCT/EP2019/070450, dated Oct. 10, 2019, 14 pages, European Patent Office, Netherlands, ISR Only.

(Continued)

*Primary Examiner* — Yuechuan Yu
(74) *Attorney, Agent, or Firm* — Maier & Maier, PLLC (57) ABSTRACT

A chemical vapor deposition head, suitable in particular for spatial atomic layer deposition at ambient pressure, is provided. The chemical vapor deposition head is produced in a single piece by additive manufacturing, with a network of distribution ducts being formed by cavities formed in the piece. A method for depositing at least one thin layer by such a chemical vapor deposition head is also provided. A vapor deposition system is further provided. The vapor deposition system includes the chemical vapor deposition head and a carriage bearing the chemical vapor deposition head and allowing it to be moved over a substrate. The carriage may also include one or more reservoirs of precursors also produced by additive manufacturing.

10 Claims, 9 Drawing Sheets

(56) References Cited

U.S. PATENT DOCUMENTS

| | | |
|---|---|---|
| 2003/0113451 A1* | 6/2003 | Mayer .................... C23C 16/54 |
| | | 427/255.28 |
| 2005/0066893 A1 | 3/2005 | Soininen |
| 2009/0081886 A1 | 3/2009 | Levy et al. |
| 2009/0217878 A1 | 9/2009 | Levy et al. |
| 2010/0041213 A1* | 2/2010 | Lee .................. C23C 16/45551 |
| | | 118/729 |
| 2010/0186800 A1 | 7/2010 | Baker |
| 2017/0204989 A1 | 7/2017 | Burkhart et al. |
| 2017/0252756 A1* | 9/2017 | Iizuka ............... C23C 16/45565 |
| 2017/0372923 A1 | 12/2017 | Terada et al. |

FOREIGN PATENT DOCUMENTS

| | | |
|---|---|---|
| JP | 7-12475 U | 2/1995 |
| JP | 2002-367911 A | 12/2002 |
| JP | 2011-66166 A | 3/2011 |

OTHER PUBLICATIONS

Muñoz-Rojas, David, et al., "Spatial atmospheric atomic layer deposition: a new laboratory and industrial tool for low-cost photovoltaics", Material Horizons 2014, vol. 1, No. 3, pp. 314-320, Royal Society of Chemistry, UK.

Chinese Office Action issued in Chinese Patent Application No. 201980050597.1 mailed Sep. 15, 2022, with English translation.

* cited by examiner

COMPACT HEAD AND COMPACT SYSTEM FOR VAPOR DEPOSITION

CROSS-REFERENCE TO RELATED APPLICATIONS

The present application is a national phase entry of PCT/EP2010/070450, filed on Jul. 30, 2019, which claims the benefit of priority of French Patent Application No. 1857072, filed Jul. 30, 2018, the entire contents of which are hereby incorporated by reference in their entirety for all purposes.

TECHNICAL FIELD

The invention relates to a thin layer vapor deposition head, and more particularly to a deposition head suitable for implementing the SALD—spatial atomic layer deposition—technique. The invention relates also to a thin layer deposition system comprising such a head.

BACKGROUND

Atomic layer deposition (ALD) is a chemical vapor deposition (CVD) technique developed in the 1960-70s which offers the unique possibility of depositing thin layers of high quality at low temperature, with precise thickness control, an exceptional uniformity and an excellent coverage even in the presence of steps having a significant aspect ratio. That is due to the spontaneously self-limiting nature of the growth by ALD, which is performed directly and selectively on the surface of the sample upon the sequential exposure of different precursors conveyed by inert gas flows (typically $N_2$ or Ar). Thus, whereas in the traditional chemical vapor deposition techniques the precursors are injected at the same time and react on the substrate by thermal or plasma activation, in the case of ALD the precursors are injected by consecutive pulses, separated in time, thus allowing the surface selective and spontaneously resolvent nature of the technique.

Since the 1990s, ALD has become the technique of choice in the semiconductor industries and the industries producing large screens. The later advent of nanosciences and nanotechnologies has broadened the use of ALD to research laboratories.

Despite its unique advantages, ALD does have two major drawbacks which have limited its industrial application: the slowness of the deposition and the need to operate in a vacuum. Consequently, ALD is, these days, used solely in the industries in which no other technique is available.

Spatial ALD (SALD) provides a solution to the problem of the slowness of "conventional" ALD. This technique, initially proposed by T. S. Suntola et al. in the patent U.S. Pat. No. 4,389,973, consists in separating the precursors in space rather than in time. Thus, in SALD, the precursors are delivered constantly in correspondence with different portions of the surface of the substrate, separated by a zone of inert gas, while the sample is displaced from the location of one precursor to the other by passing through the zone of inert gas. That makes it possible to increase the rate of deposition by up to two orders of magnitude. Moreover, it has been demonstrated that, by arranging the SALD deposition head in immediate proximity (100 µm or less) from the deposition surface and by equipping it with gas suction apertures, it is possible to operate at ambient pressure, and therefore outside of a vacuum chamber. This is then called ambient pressure SALD (AP-SALD). See for example US 2009/0217878 and US 2009/081886.

Figure 1:
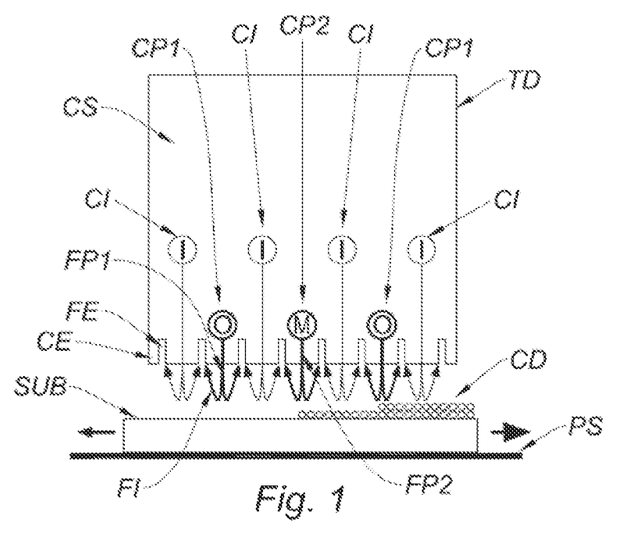
FIG. 1, already described, the principle of the AP-SALD technique.

FIG. 1 is a schematic illustration of the principle of AP-SALD. The deposition head TD is passed through by ducts CI which convey an inert gas I, such as nitrogen $N_2$ or argon Ar; ducts CP1 conveying a gas charged with a first precursor, for example an oxidant O such as water vapor ($H_2O$); ducts (in fact, just one in FIG. 1) CP2 conveying a gas charged with a second precursor, for example an organometallic compound M such as $Al(CH_3)_3$, and discharge ducts CE linked to a pump. The different ducts emerge in respective slits (FP1 for the first precursor, FP2 for the second precursor, PI for the inert gas, FE for the discharge) formed in a face of the deposition head. The slits are formed such that:

- one slit linked to the duct CI is interposed between two slits linked to ducts CP1, CP2 conveying different precursors, and between these slits and each lateral edge of the head;
- one slit linked to a discharge duct is interposed between two slits linked to other ducts.

The flows of the gases are represented by arrows. It can be seen that the inert gas forms "barriers" which separate the gas flows containing the precursors from one another and from the ambient air. A substrate SUB, borne by a support or plate PS, is arranged facing and at a short distance from (<100 µm, for example 50 µm) the slits, the plate being driven by an oscillatory movement parallel to the face of the head which bears the slits. The successive reaction of the molecules of the two precursors with one another and with the surface of the substrate leads to the formation of a thin deposited layer CD. In the case where the precursors are $H_2O$ and $Al(CH_3)_3$, the layer CD is of $Al_2O_3$.

Variants are possible, for example the number of precursors can be greater than two.

A more detailed presentation of the AP-SALD technique and of its applications can be found in the article by David Muñoz-Rojas and Judith MacManus Driscoll entitled "Spatial atmospheric atomic layer deposition: a new laboratory and industrial tool for low-cost photovoltaics", Material Horizons 2014, vol. 1, No. 3, p. 314-320.

Figure 2A:
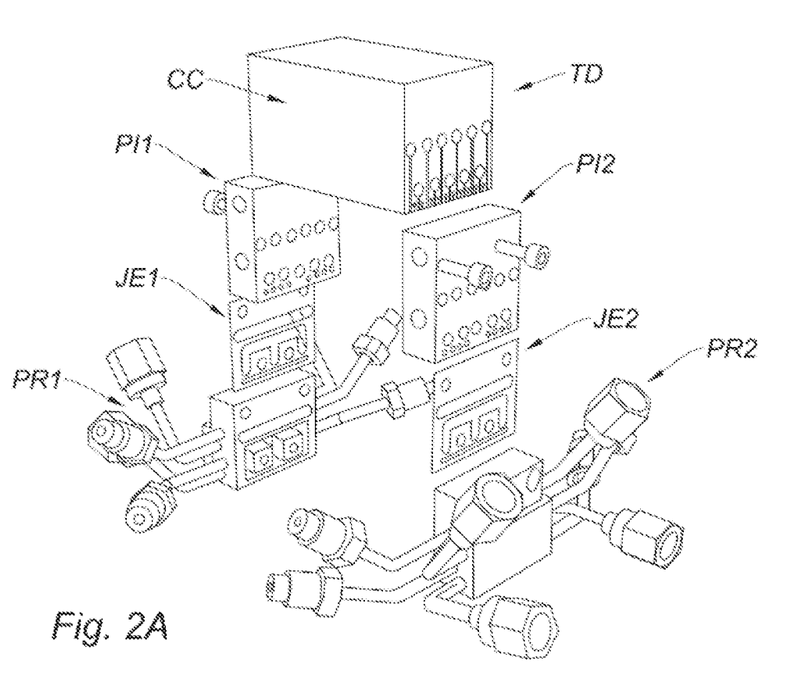
FIGS. 2A and 2B, already described, an AP-SALD deposition head of conventional type.
Figure 2B:
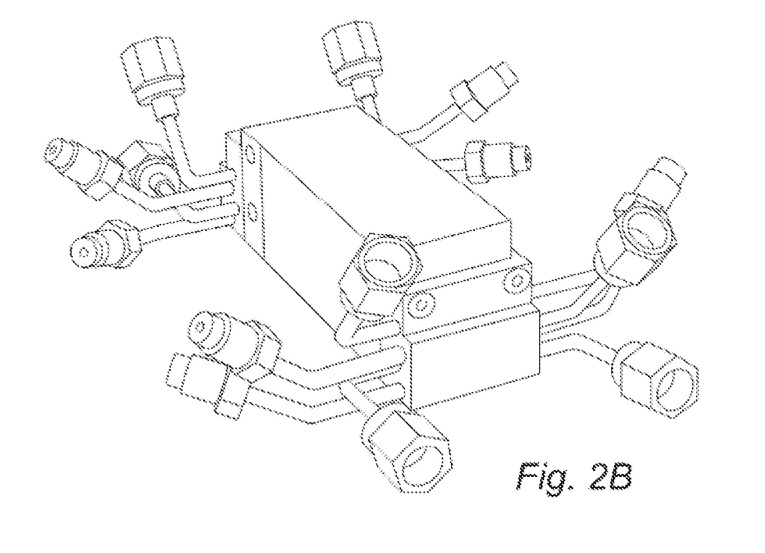

The AP-SALD technique constitutes a significant enhancement over conventional ALD. It nevertheless remains relatively complex and costly. In some cases, closed reaction chambers, similar to those used in conventional ALD and CVD, are used. In other cases, like that described by the abovementioned document US 2009/0217878, the deposition is performed in the open air. In this latter case, the deposition head is a metallic structure of small dimensions (for example of the order of 40 $cm^3$) but having a complex structure, comprising at least four independent gas distribution networks (two for the gas flows conveying the precursors, one for the separating inert gas, one for the discharging of the gases), and external couplings to gas intake or suction ducts. This head is composed of several parts, which must be manufactured, polished, assembled and welded with great precision. FIG. 2A shows an exploded view of an example of AP-SALD deposition head "in immediate proximity" thereof, and FIG. 2B shows an assembled view of the same part. The manufacturing of such a head is lengthy and costly.

Figure 3:
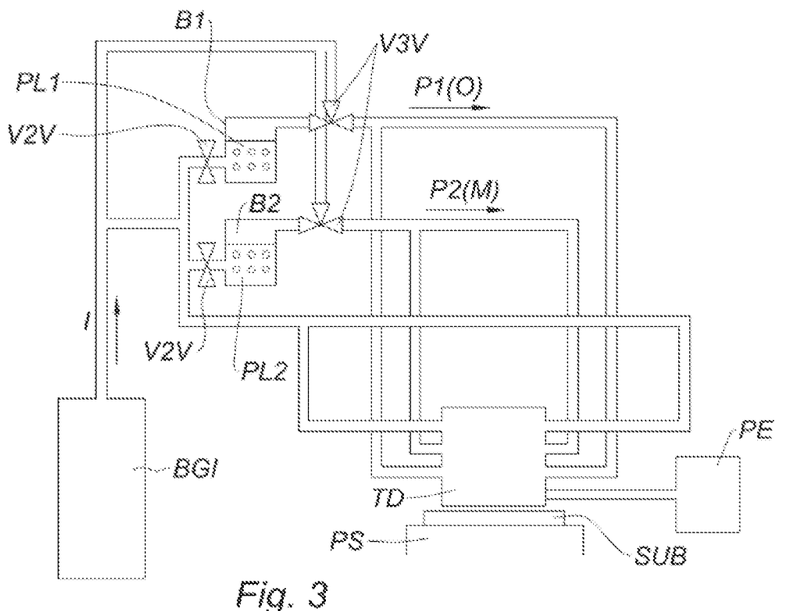
FIG. 3, already described, a schematic representation of a complete AP-SALD unit.
Figure 4A:
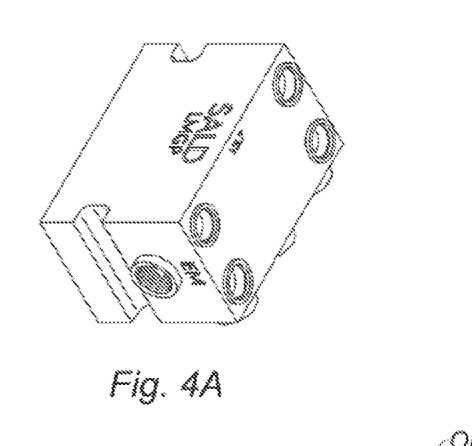
FIGS. 4A-4G, different views of a deposition head according to a first embodiment of the invention.
Figure 4B:
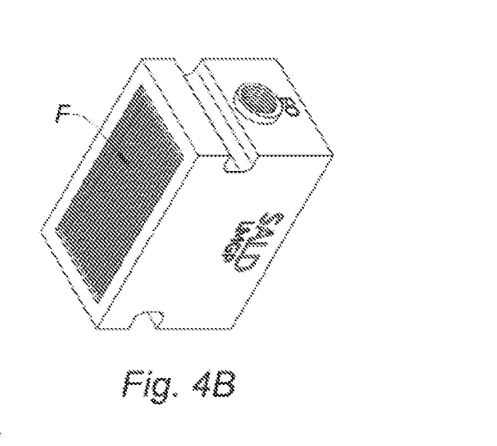
Figure 4C:
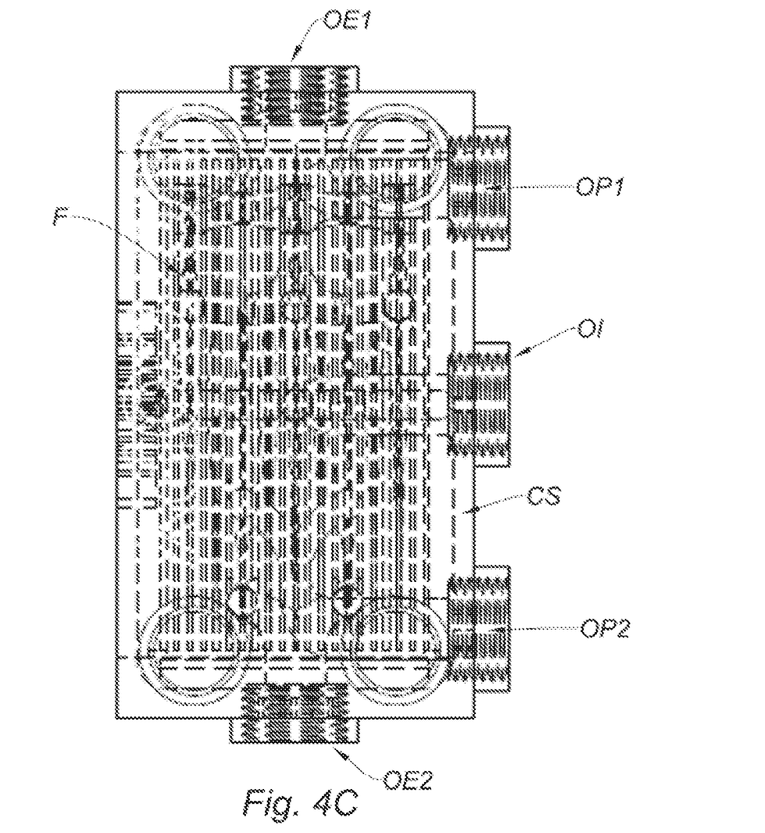
Figures 4D, 4E:
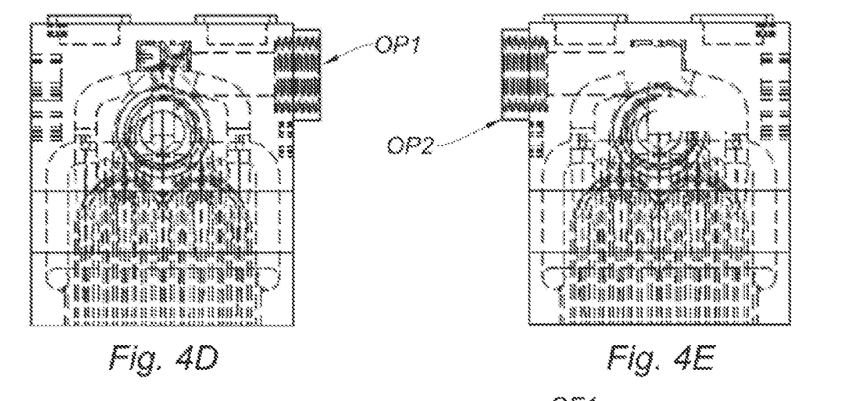
Figure 4F:
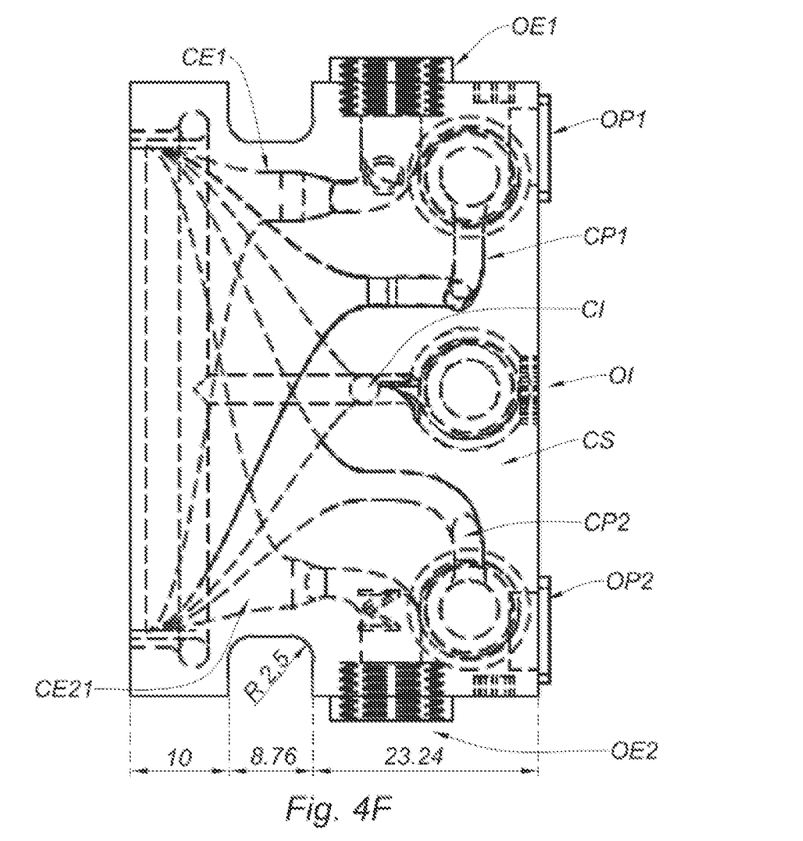
Figure 4G:
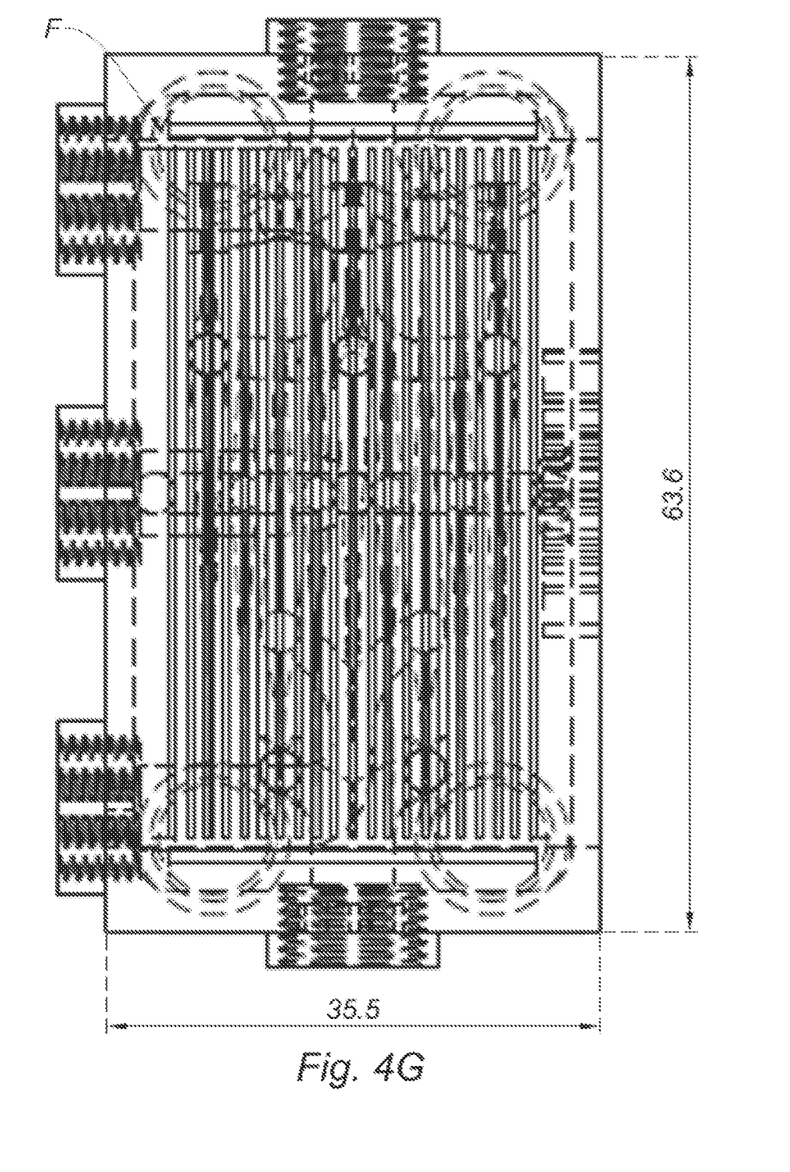

The head of FIGS. 2A and 2B comprises a central body CC inside which there are hollowed out, by machining, the ducts described above with reference to FIG. 1, and whose bottom face bears the slits. On either side of this central body there are arranged two injection pieces PI1, PI2, in which extensions of the ducts are hollowed out, but without the slits. These injection pieces, welded to the central body, are connected, by screws and via seals JE1, JE2, to coupling pieces PR1, PR2 which are used to link the ducts, via pipes that are not represented, to bubblers, sources of inert gases and, if appropriate, to one or more pumps. The use of pumps to discharge the gases is not always necessary: the containment by the surface of the substrate can suffice to force the gases to rise through the discharge slits. The bubblers are containers containing the precursors in the liquid state in which an inert gas bubbles; the gas emerges therefrom charged with precursors, ready to be brought to the deposition head (in other cases, the gas does not bubble, but passes simply over the precursor, which can in this case be solid; use of the term "bubbler" then stems from a misuse of language). The latter also receives "pure" inert gas which, as is explained above, is used to separate the regions of deposition of the different precursors. The pump is used to evacuate the gases. That is represented in FIG. 3. In this figure BGI represents the bottle which supplies the inert gas I, B1 and B2 the bubblers B1 and B2 containing precursors, here in the liquid state, PL1, PL2 and PE the pump for the suction and the discharging of the gas. The inert gas I reaches the deposition head, through distinct pipes, both directly and after having bubbled in the bubblers; note, in the upper part of the figure, a duct which brings the inert gas to dilute the gas flows leaving the bubblers; this duct is also used for the purging operations. Valves make it possible to isolate the bubblers, in order to allow them to be replaced and the pipes to be purged. More specifically, two-way valves V2V are arranged at the input of each bubbler, and three-way valves V3V control the dilution and allow the purging.

The reference P1 denotes the inert gas charged with the first precursor ("O" in FIG. 1) and P2 denotes the inert gas charged with the second precursor ("M" in FIG. 1). In the system represented in the figure, a single discharge is provided; however, to avoid undesirable chemical reactions, it may be preferable to separately discharge—by means of distinct ducts, pipes and pumps—the gases; that notably makes it possible to analyze them separately, recycle them or eliminate them safely.

Now, the pipes which bring the gases charged with precursor molecules must be saturated with precursors before the start of the actual deposition operations, then be purged before changing precursors to deposit new materials, which takes a lot of time and leads to a wastage of large quantities of precursors and a risk of cross-contamination. Furthermore, it is difficult to displace the head fixed to the pipes; it is therefore generally preferable to keep it fixed and displace the deposition substrate. That limits the choice of substrates that can be used; it is for example difficult, even impossible, to perform an atomic layer deposition on a portion of an object of large dimensions.

BRIEF SUMMARY

The invention aims to resolve, wholly or partly, the abovementioned problems and to render the AP-SALD technique more flexible, faster and less costly to implement.

In accordance with one aspect of the invention, that is obtained by the use of a deposition head produced in a single piece by additive manufacturing ("3D printing"). That allows for a reduction of costs, together with a wider choice of the materials that can be used (depending on the precursors to be delivered, a deposition head can be produced in metal, but also in ceramic, even in plastic material), a greater freedom in the forms that can be produced and a greater miniaturization. It thus becomes possible to manufacture "on demand" a deposition head optimized for a particular process and for the production of a particular layer or multilayer structure.

Documents US 2017/204989 and US 2017/372923 disclose gas distribution networks produced by additive manufacturing.

In accordance with another aspect of the invention, the bubblers can be brought close to the deposition head and mounted with it on a movable carriage. Thus, it is no longer the substrate which is displaced under a fixed deposition head, but the carriage bearing the deposition head and the bubblers—preferably miniaturized (less than 10 ml, for example 1 or 2 ml)—which is displaced over the substrate, which can thus be an object of large dimensions or, more generally, non-removable. The shortening of the gas intake ducts reduces the wastage of precursors and reduces the duration of the saturation and purging phase. Furthermore, the entire assembly can be heated to a uniform temperature, which is useful in the case of relatively non-volatile precursors. These miniaturized bubblers, for example produced by additive manufacturing, can be provided already pre-filled with the precursors, and thus form a "consumable" similar to an ink cartridge of a printer.

According to another embodiment, the bubblers can be produced in a single piece with the deposition head by additive manufacturing. The assembly formed by the deposition head and the bubblers, which can moreover be supplied already pre-filled with the precursors and form a "consumable", allows, in certain cases, the purging phase to be dispensed with, and therefore the production of complex structures requiring several depositions of thin layers of different compositions to be simplified.

One subject of the invention is therefore a chemical vapor deposition head comprising a solid body comprising:

at least one first opening for receiving a first input gas flow conveying a first precursor, a second opening for receiving a second input gas flow conveying a second precursor, a third opening for receiving a third input inert gas flow and a fourth opening for discharging a fourth gas flow;

an output face bearing a plurality of orifices; and a network of distribution ducts, formed inside the solid body, linking each opening to at least one of said orifices;

wherein each orifice linked to the first opening is separated from the or each closest orifice linked to the second opening by at least one orifice linked to the third opening and by two orifices linked to the fourth opening, arranged on either side of the orifice linked to the third opening;

characterized in that the solid body is produced in a single piece by additive manufacturing, the network of distribution ducts being formed by cavities formed in said piece.

According to particular embodiments of such a deposition head:

The orifices can be rectilinear and mutually parallel slits.

At least one slit linked to the first opening and at least one slit linked to the second opening can have a shorter length than the slits linked to the third opening and to the fourth opening and be offset with respect to one another in the lengthwise direction.

The orifices can form concentric closed curves, and preferentially concentric circles.

The head can also comprise at least one first reservoir and one second reservoir, linked respectively to the first opening and to the second opening by respective output ducts, each said reservoir comprising a hollow volume capable of containing a precursor in the liquid or solid state and an input duct arranged so that a gas flow injected into the input duct enters into contact with the precursor before arriving at the respective output duct, the first and the second reservoirs, and the input and output ducts, being produced in a single piece with the solid body by additive manufacturing.

At least one said reservoir can be a bubbler whose hollow volume is intended to contain a precursor in the liquid state, the input duct and the output duct being arranged so that the gas flow injected into the input duct bubbles through the liquid before arriving at the output duct.

The hollow volume of said or each bubbler can contain a structure configured to lengthen the path traveled by the bubbles of gas between the input duct and the output duct.

Another subject of the invention is a vapor deposition system comprising such a head and a carriage bearing said head and allowing it to be displaced above a substrate.

Another subject of the invention is a vapor deposition system comprising such a head, a carriage bearing said head and allowing it to be displaced over a substrate and at least one first reservoir and one second reservoir, linked respectively to the first opening and to the second opening by respective output ducts, each said reservoir comprising a hollow volume capable of containing a precursor in the liquid or solid state and an input duct arranged so that a gas flow injected into the input duct enters into contact with the precursor before arriving at the respective output duct, the first reservoir and the second reservoir being also borne by said carriage. The reservoirs can be produced by additive manufacturing, mounted removably and interchangeably and each filled with one said precursor in the liquid or solid state. Alternatively, the reservoirs can be produced in a single piece with the solid body by additive manufacturing.

Yet another subject of the invention is a method for depositing at least one thin layer, or a thin-layered device, on a substrate comprising:

the design of a vapor deposition process suitable for producing said layer or said device;

the design of such a deposition head, specially adapted to implement such a process;

the production of said deposition head by additive manufacturing; and the use of said head for implementing said process.

Said deposition process is advantageously performed spatially selectively on the substrate.

BRIEF DESCRIPTION OF THE SEVERAL VIEWS OF THE DRAWING(S)

Other features, details and advantages of the invention will emerge on reading the description given with reference to the attached drawings given by way of example and which represent, respectively.

DETAILED DESCRIPTION

FIGS. 4A-4G are different views of a deposition head according to a first embodiment of the invention. These figures are to scale, but the scale is not the same from one figure to another; some bear dimensions in millimeters, given purely by way of example. The references OP1, OP2, OI, OE1, OE2 represent, respectively, the openings linked to the ducts CP1, CP2, CI, CE1 (discharging the gas containing the first precursor) and CE2 (discharging the gas containing the second precursor); the reference F denotes the set of slits produced in the "bottom" face of the head.

Contrary to the deposition head of FIGS. 2A-2B, that of FIGS. 4A-4G is composed of a single piece, which is made possible by its production by additive manufacturing, or "3D printing". The use of additive manufacturing notably allows for a greater freedom in the form of the gas intake and discharge ducts, which are simple hollows formed in the solid body CS of the head. It also allows assembly and welding tasks, which are time-consuming and sources of defects, to be avoided, and allows a deeper miniaturization of the deposition heads to be obtained.

The head of FIGS. 4A-4G can be metallic, but also made of ceramic material, even plastic (polymer). The use of a plastic material is possible only in the case of precursors that are sufficiently volatile, that do not need to be brought to a high temperature, and subject to chemical compatibility; it allows the manufacturing costs to be considerably reduced.

Several additive manufacturing techniques can be suitable for producing a deposition head according to the invention, dependent on the material used. Nonlimiting examples that can be cited include stereolithography and fused filament fabrication for the polymer materials, selective laser fusion for the metallic materials, selective laser sintering for the metals and ceramics, but also certain polymer materials, electron beam fusion for certain metals such as titanium.

Figure 5A:
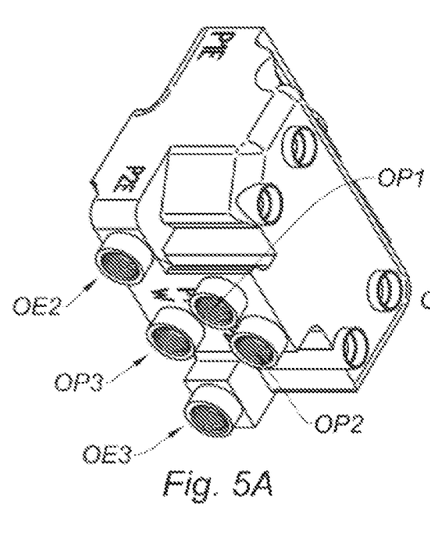
FIGS. 5A-5C, two views of a deposition head according to a second embodiment of the invention, and FIG. 5D, an enlarged detail of FIG. 5B.
Figure 5B:
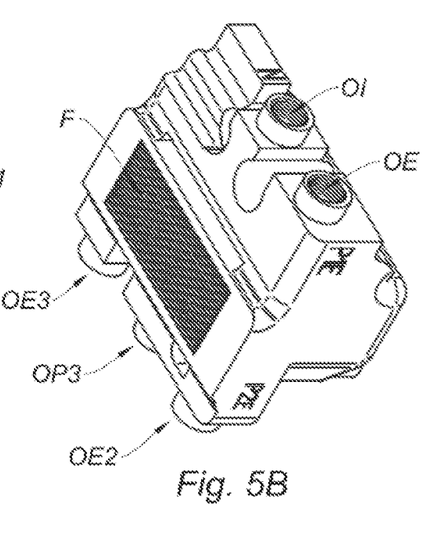
Figure 5C:
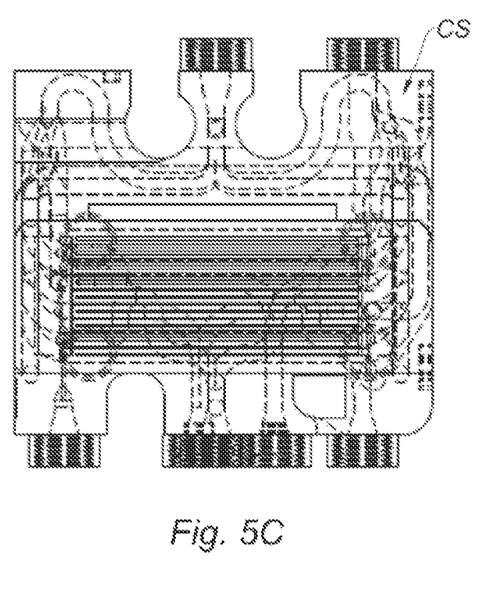

The use of additive manufacturing techniques simplifies the production and the use of deposition heads specifically optimized for a deposition process, which is in turn specifically designed for the deposition of a layer or a particular multilayer structure. That is illustrated by FIGS. 5A-5D. FIGS. 5A to 5C are three views of another deposition head, also produced in a single piece by additive manufacturing, allowing a deposition to be performed from three precursors (for example two metallic compounds and water vapor serving as oxidant). The references OP1, OP2, OP3, OI, OE1, OE2 represent, respectively, the intake openings for the first, second and third precursors and the inert gas, and the gas discharge openings containing the first, second and third precursors.

Figure 5D:
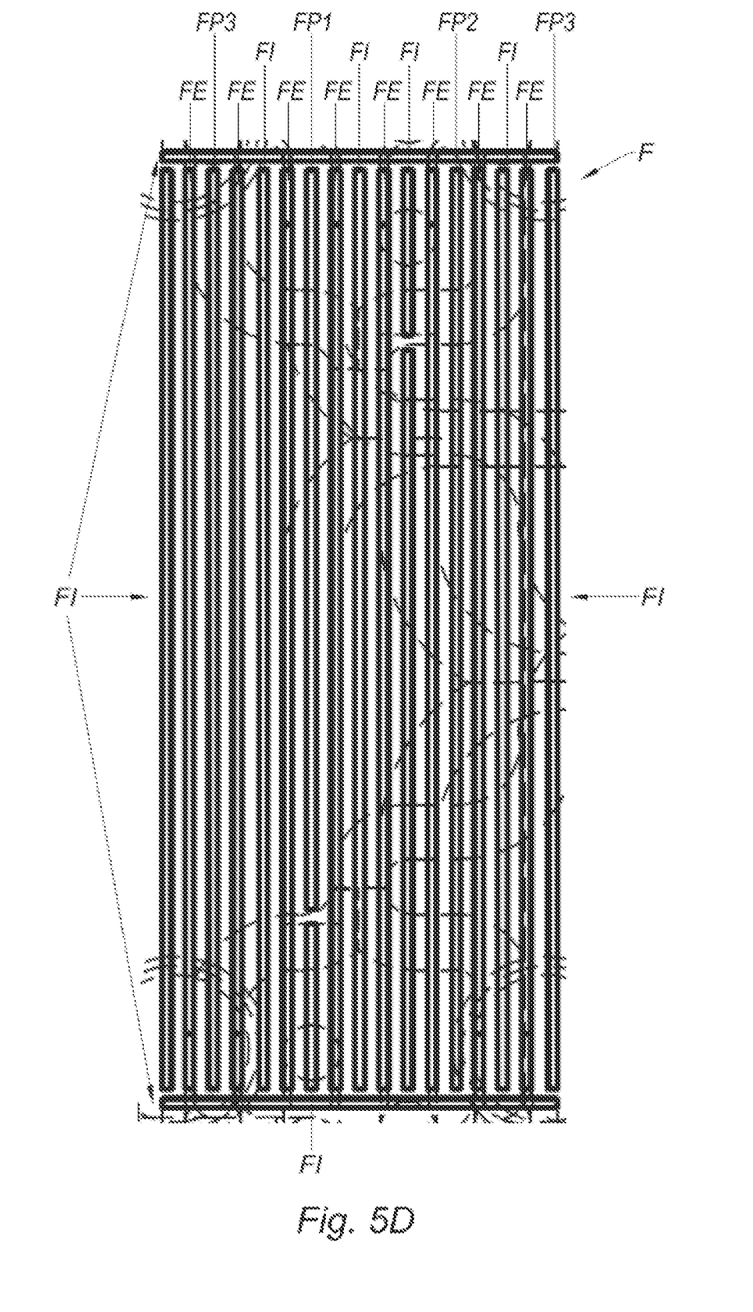
Figure 9A:
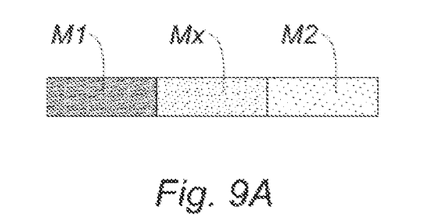
FIGS. 9A, 9B and 9C, three semiconductive structures that can be deposited by means of the head of FIGS. 5A-5D.
Figure 9B:
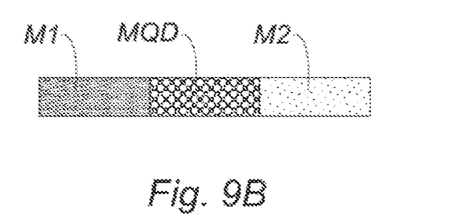
Figure 9C:
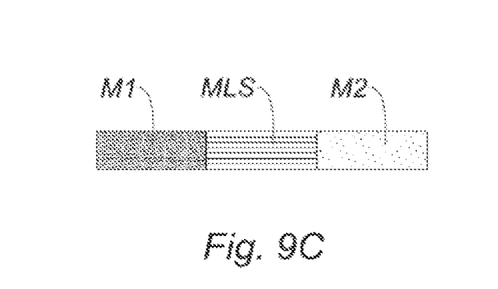

FIG. 5D more specifically represents the set F of slits; this set comprises slits FP1, FP2, FP3, FI, FE1, FE2, FE3 (respectively, intake for the first, second and third precursors and for the inert gas; discharge—for simplicity, no distinction is made among the slits linked to the different discharge ducts). One slit FP1 and one slit FP2 have a shorter length than that of the set, and are offset with respect to one another in the lengthwise direction. That, for example, allows complex structures to be deposited, the composition of which varies in a spatial direction parallel to the orientation of the lines. In particular, that makes it possible to obtain a structure composed of a region of a first material M1 (for example, $Cu_2O$), of a region of a second material M2 (for example, ZnO) and, between the two, of a region composed either of a mixture of the two materials (FIG. 9A, reference Mx), or of a nano-composite structure (for example multiple quantum dots or bulk heterojunctions) of the two materials (FIG. 9B, reference MQD), or even of a multilayer structure of the two materials (FIG. 9C, reference MLS).

According to a preferred variant of the deposition head of FIGS. 5A-5D, an oxidant deposition slit (FP3)—quite obviously surrounded by inert gas discharge and intake slits, according to the principles explained above—is also provided between the slits FP1 and FP2. That is not however essential.

It will be noted that, in the system of slits of FIG. 5D (but that is also true for the deposition head of FIGS. 4A-4G, the inert gas intake slits, FI, form a frame around the other slits. Two slits FI are oriented at right angles with respect to the direction of all the other slits, and two other slits FI lengthen the slits FP1, FP2 which, as stated above, are shorter. That allows for an assurance that the precursors will not come into contact with the ambient air.

It will also be noted that the system of slits F of FIG. 5D comprises discharge slits FE1 linked to the opening OE1 and discharge slits FE2 linked to the opening OE2.

Until now, only cases in which the slits are continuous, rectilinear and parallel to one another (except for two slits FI "closing the ends" of the head, which are at right angles to the others). That is not however essential: the slits need not be strictly parallel and/or rectilinear. They can moreover be discontinuous, for example composed of several small orifices aligned and close together. Generally, a slit is understood to mean an orifice, or a set of orifices linked to one another, having a width very much greater (at least by a factor of 10) than its width. In some cases, the gases can be brought and/or discharged through orifices, at least some of which may not be considered as slits in the proper sense.

Figure 6:
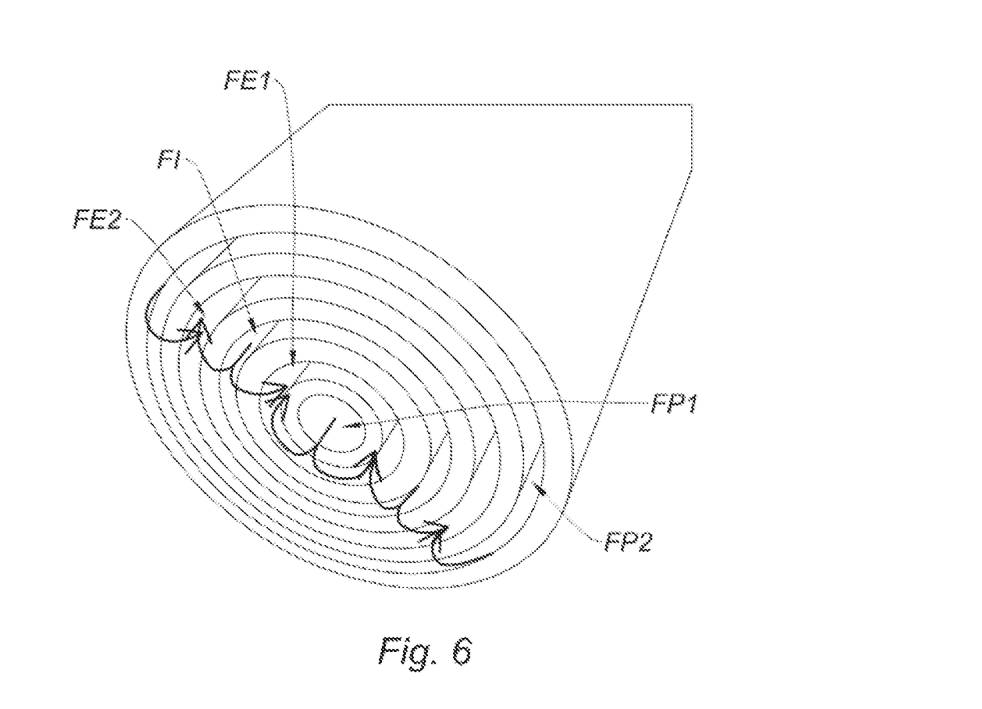
FIG. 6, a simplified representation of a deposition head according to a fourth embodiment of the invention, more greatly miniaturized.

For example, FIG. 6 illustrates a deposition head according to an alternative embodiment having a tubular structure, in which the slits FE1, FI, FE2, FP2 form concentric circles (more generally, closed curves) around a central orifice FP1 which does not strictly speaking constitute a slit. This embodiment allows the miniaturization of the deposition head to be pushed particularly far, to the production of what could be called a CVD/ALD "pen".

Figure 7:
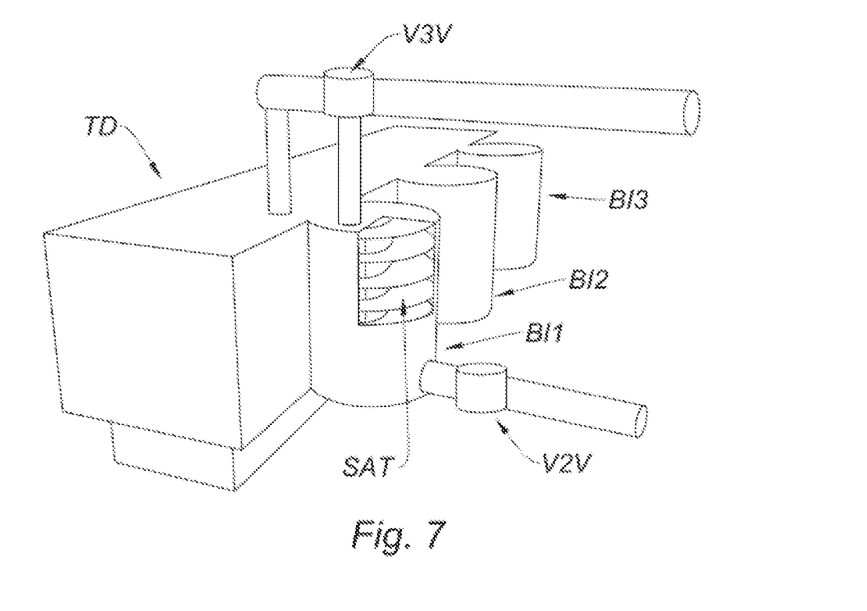
FIG. 7, a simplified representation of a deposition head according to a fifth embodiment of the invention, incorporating bubblers.

The additive manufacturing can also be used to manufacture the bubblers, which can moreover be incorporated in the deposition head. In this respect, FIG. 7 illustrates an assembly formed by a deposition head, for example similar to that of FIGS. 4A-4G or FIGS. 5A-5D, and three incorporated bubblers BI1, BI2, BI3. In this embodiment, the incorporated bubbler BI1 is a bubbler "in the strict sense", that is to say intended to be filled with a precursor in the liquid state and comprising a gas input duct in its bottom part and a gas output duct in its top part, such that the gas bubbles in the liquid before leaving the bubbler to be injected into the head. The gas input and output ducts can also be produced by additive manufacturing, and be incorporated in the structure. Note that there is a two-way valve V2V at the input of the first bubbler and a three-way valve V3V at the intersection between the duct outgoing from the first bubbler and the dilution duct.

The bubbler BI1 also comprises a structure SAT, for example in helical form, suitable for lengthening the path of the bubbles inside the liquid so as to facilitate/ensure the saturation of the gas with molecules of the precursor. The helical form is not essential, the structure SAT could for example be in chicane form, or a porous or cross-linked structure (which makes smaller bubbles). The elements BI2 and BI3 need not be bubblers in the strict sense, but more simply reservoirs including a gas injection pipe and a discharge pipe (not represented), which are not necessarily arranged so as to allow a bubbling; the precursor can moreover be solid, for example in powder form, providing that it is sufficiently volatile. The bubblers, or some of them, can also include heating elements, for example electrical resistors or coils for a heated liquid, which can, if necessary, be produced in incorporated fashion by additive manufacturing.

According to another embodiment, the reservoirs and bubblers can be produced by additive manufacturing, but not be incorporated in the head. In this case, the head preferably comprises an accommodating seat allowing for a rapid mounting of the reservoirs, for example by pressure, which are thus interchangeable. These reservoirs can moreover be pre-filled with precursor, in the manner of printer ink cartridges.

Whether they are incorporated or not, the reservoirs/bubblers produced by additive manufacturing typically have a content smaller than 10 ml, for example between 1 and 2 ml. There are on the market electric valves that are small enough to be compatible with such reservoirs.

Figure 8:
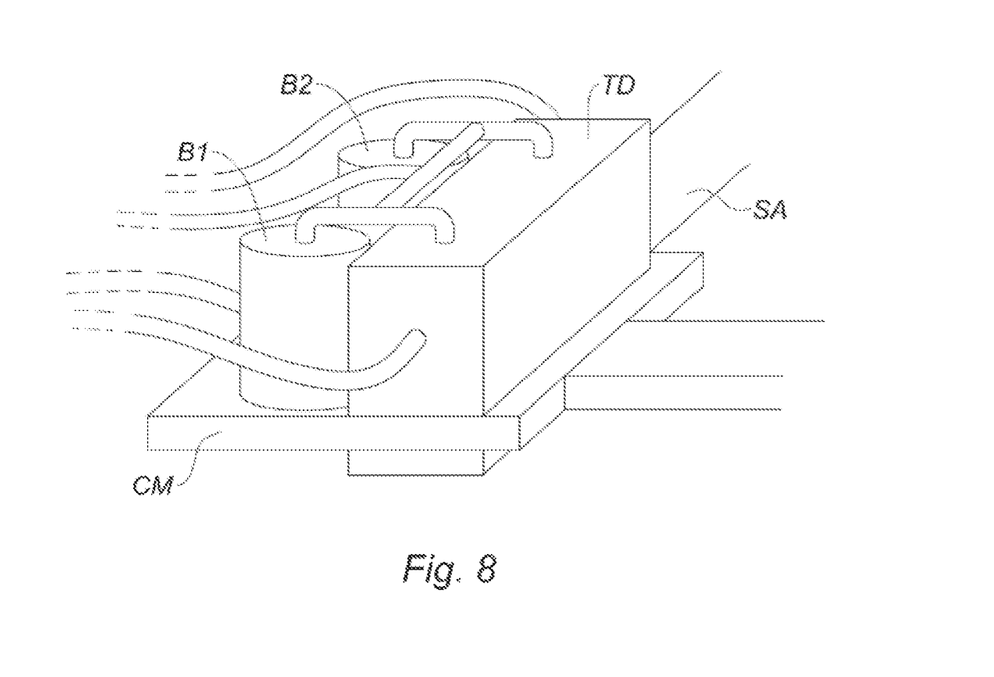
FIG. 8, a deposition system according to a fifth embodiment of the invention.

The miniaturization made possible by the use of additive manufacturing techniques thus allows the reservoirs to be close to the print head. Because of the small volumes involved, that is not dangerous even in the presence of flammable precursors. As has been explained above, that makes it possible to reduce the wastage of precursors, to substantially reduce the duration of the purging phases and to reduce the risks of contamination. That also makes it possible to more radically modify the structure and the operation of an AP-SALD deposition system by mounting the assembly formed by the deposition head TD and the reservoirs/bubblers B1, B2 (incorporated or not) on a carriage CM that can be displaced over a substrate which is kept stationary—contrary to the mode of operation of the conventional system described above with reference to FIG. 1. Such a system is illustrated schematically in FIG. 8. The movable assembly CM/TD/B1/B2 is linked to a frame that is not represented via an actuation system SA, typically comprising electric motors allowing for a displacement of the carriage in one, two or three dimensions (and, if necessary, its orientation on one, two or three axes) and by two or three flexible pipes—a gas intake pipe and one or two discharge pipes. The two-way and three-way valves are not represented so as not to clutter the figure.

The embodiment of FIG. 6 proves particularly advantageous when the deposition head is displaced over the substrate. Indeed, its circular form allows the deposition to be performed regardless of the direction of the displacement of the carriage, without the need to turn the head for the slits to remain at right angles to this direction of displacement.

The invention is particularly suited to the selective deposition of SALD type. As indicated previously, a deposition head as represented in FIGS. 5A to 5D allows for a spatially selective deposition by adapting the length of the slits. Likewise, the head represented in FIG. 6 is also suited to selective deposition. This head can be miniaturized and the spatial selection of the deposition zones is done then by displacing a carriage on which the head is mounted.

The invention has been described with reference to its application to the AP-SALD technique, but it can also be suitable for implementing other methods of CVD type.

The invention claimed is:

1. A chemical vapor deposition head comprising a solid body, the solid body comprising:
    at least one first opening for receiving a first input gas flow conveying a first precursor, a second opening for receiving a second input gas flow conveying a second precursor, a third opening for receiving an input inert gas flow, and a fourth opening for discharging a gas flow;
    an output face bearing a plurality of orifices; and
    a network of distribution ducts, formed inside the solid body, linking each opening to at least one of said orifices;
    wherein each orifice linked to the first opening is separated from the one or more closest orifices linked to the second opening by at least one orifice linked to the third opening and by two orifices linked to the fourth opening, arranged on either side of the orifice linked to the third opening; and
    wherein the solid body is produced in a single piece by additive manufacturing, the network of distribution ducts being formed by cavities formed in said piece,
    the chemical vapor deposition head further comprising at least one first reservoir and one second reservoir, linked respectively to the first opening and to the second opening by respective output ducts, each of said first reservoir and said second reservoir comprising a hollow volume capable of containing the first or second precursor in a liquid or solid state and an input duct arranged so that a gas flow injected into the input duct enters into contact with the first or second precursor before arriving at one of the respective output ducts, the first and the second reservoirs, and the input ducts and output ducts, being produced in a single piece with the solid body by additive manufacturing;
    wherein the first reservoir and the second reservoir are incorporated in the solid body or the first reservoir and the second reservoir are interchangeably mounted on an accommodating seat of the solid body.

2. The deposition head as claimed in claim 1, wherein the orifices are rectilinear and mutually parallel slits.

3. The chemical vapor deposition head as claimed in claim 2, wherein at least one slit linked to the first opening and at least one slit linked to the second opening have a shorter length than slits linked to the third opening and to the fourth opening and are offset with respect to one another in a lengthwise direction.

4. The deposition head as claimed in claim 1, wherein the orifices form concentric closed curves.

5. The chemical vapor deposition head as claimed in claim 1, wherein at least one of said first reservoir and said second reservoir is a bubbler whose hollow volume is intended to contain the first or second precursor in the liquid state, the input duct and the output duct being arranged so that the gas flow injected into the input duct bubbles through the first or second precursor in the liquid state before arriving at the output duct.

6. The chemical vapor deposition head as claimed in claim 5, wherein the hollow volume of each bubbler contains a structure configured to lengthen a path traveled by gas bubbles between the input duct and the output duct.

7. A vapor deposition system comprising the chemical vapor head as claimed in claim 1 and a carriage bearing said chemical vapor deposition head and allowing it to move over a substrate.

8. A method for depositing at least one thin layer, or a thin-layered device, on a substrate comprising:
    designing a vapor deposition process suitable for producing said layer or said device;
    designing the chemical vapor deposition head as claimed in claim 1, specially adapted to implement the vapor deposition process;
    producing said chemical vapor deposition head by additive manufacturing; and using said chemical vapor deposition head to implement said vapor deposition process.

9. The method as claimed in claim 8, wherein said vapor deposition process is performed spatially selectively on the substrate.

10. The deposition head as claimed in claim 1, wherein the orifices form concentric circles.

* * * * *